United States Patent [19]

Kameyama et al.

[11] Patent Number: 5,236,851

[45] Date of Patent: Aug. 17, 1993

[54] METHOD FOR FABRICATING SEMICONDUCTOR DEVICES

[75] Inventors: Shuichi Kameyama, Itami; Hiroyuki Sakai, Osaka; Kazuya Kikuchi, Osaka; Masaoki Kajiyama, Osaka, all of Japan

[73] Assignee: Matsushita Electric Industrial Co., Ltd., Osaka, Japan

[21] Appl. No.: 847,133

[22] Filed: Mar. 6, 1992

Related U.S. Application Data

[62] Division of Ser. No. 378,671, Jul. 12, 1989, Pat. No. 5,116,770.

[30] Foreign Application Priority Data

Jul. 14, 1988 [JP]  Japan ................................ 63-175705

[51] Int. Cl.[5] .......................................... H01L 21/336
[52] U.S. Cl. ............................................ 437/29; 437/30; 437/41; 437/46; 437/47; 437/918
[58] Field of Search ........................ 437/29, 30, 41, 46, 437/47, 50, 59, 60, 918, 933; 148/DIG. 136, DIG. 53, DIG. 82

[56] References Cited

U.S. PATENT DOCUMENTS

| | | | |
|---|---|---|---|
| 3,576,478 | 4/1971 | Watkins et al. | 437/47 |
| 4,208,781 | 6/1980 | Rao et al. | 437/47 |
| 4,265,685 | 5/1981 | Seki | 437/47 |
| 4,370,798 | 2/1983 | Lien et al. | 437/47 |
| 4,590,666 | 5/1986 | Goto . | |
| 4,617,066 | 10/1986 | Vasudev . | |
| 4,683,645 | 8/1987 | Naguib et al. . | |
| 4,801,556 | 1/1989 | Welbourn et al. . | |
| 4,829,015 | 5/1989 | Schaber et al. . | |
| 4,866,001 | 9/1989 | Pickett et al. . | |
| 4,950,617 | 8/1990 | Kumagai et al. | 437/47 |

FOREIGN PATENT DOCUMENTS

| | | |
|---|---|---|
| 0028739 | 5/1981 | European Pat. Off. . |
| 56-29344 | 3/1981 | Japan ........................... 437/47 |
| 0187622 | 8/1988 | Japan . |
| 0299328 | 12/1988 | Japan . |
| 0216572 | 8/1989 | Japan . |

OTHER PUBLICATIONS

Alcorn, G. "Polysilicon Resistors Compatible with Bipolar Integrated Circuits and Method of Manufacture" *IBM Technical Bulletin*, vol. 25, No. 5, Oct. 1982.
Ning, T. "Polysilicon Resistor Process for Bipolar and MOS Applications", *IBM Disclosure Bulletin*, vol. 23, No. 1, Jun. 1980.
Mayer, J. W. *Ion Implantation in Semiconductors: Silicon and Germanium*, Academic Press, Inc. ©1970, pp. 18–21.
K. Kikuchi, et al. "High Speed Bipolar LSI Process Using Self-Aligned Double Diffusion Polysilicon Technology", *IEEE*, pp. 420–423.

*Primary Examiner*—George Fourson
*Attorney, Agent, or Firm*—Lowe, Price, LeBlanc & Becker

[57] ABSTRACT

A method for fabricating a bipolar or field effect-type integrated circuit transistor is provided in which non-crystalline semiconductor films and semiconductive regions formed in a single crystal semiconductor substrate and containing high concentrations of impurities are efficiently connected with improved electric characteristics while suppressing the influence of an increase in connection resistance caused by growth of a natural oxide film. Moreover, when a first non-crystalline semiconductor film is removed from a dielectric oxide film serving as a field film and a second non-crystalline semiconductor film is formed as a ribbon-shaped pattern on the exposed field film, a resistor of high accuracy can be formed. An interconnection system having resistors of a high accuracy and a fine size is also disclosed.

3 Claims, 7 Drawing Sheets

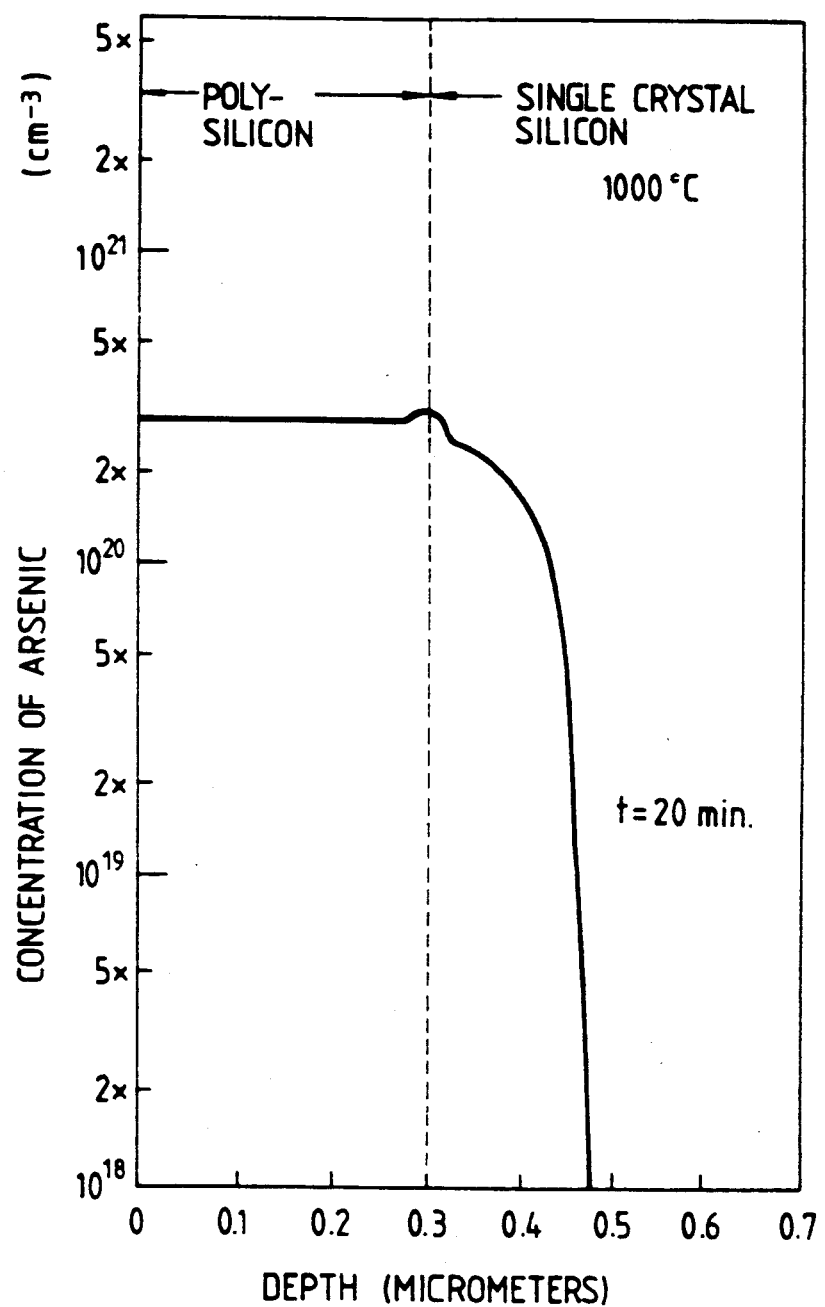

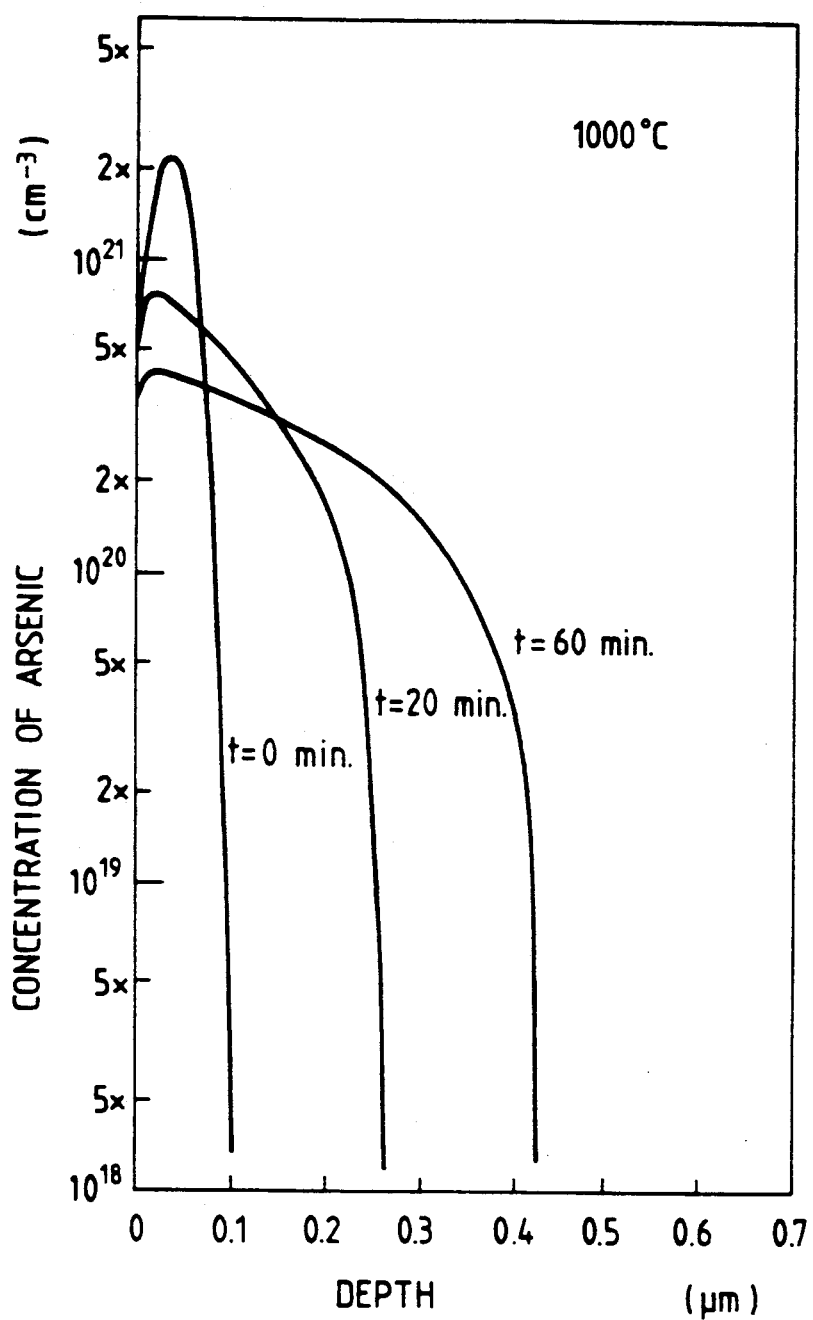

METHOD FOR FABRICATING SEMICONDUCTOR DEVICES

This application is a division of application Ser. No. 07/378,671 filed Jul. 12, 1989, now U.S. Pat. No. 5,116,770.

BACKGROUND OF THE INVENTION

1. Field of the Invention

This invention relates to semiconductor devices and more particularly, to an improved method for fabricating semiconductor devices, such as bipolar or field effect-type integrated circuit transistors, wherein electric characteristics of the interconnections between polycrystalline semiconductors and semiconductive regions with high impurity concentrations formed in a single crystalline semiconductor substrate are significantly improved.

2. Description of the Prior Art

As is known in the art, utility of a polycrystalline semiconductor in semiconductor integrated circuits of the bipolar or electric field type transistor has been recently recognized for achieving well-miniaturized elements of the circuits. For instance, in the field of bipolar technologies for silicon semiconductor, the usual practice is to employ polycrystalline silicon (polysilicon) as a material for fine wiring or as an impurity diffusion source for the formation of shallow junction. In particular, it is essential for high speed operations that a polysilicon lead electrode be used to form an emitter region of fine plane dimensions.

As an example of an emitter fabrication method wherein arsenic is diffused from polycrystalline silicon, there is known a self-aligned double diffusion polysilicon technology (Kikuchi et al, International Electron Device Meeting Technical Digest of Papers, pp. 420–423, 1986). In this method, arsenic which has been implanted into an about 300 namometer thick polysilicon film at a dose of $10^{16}/cm^2$ is thermally diffused into a single crystalline silicon substrate at 900° C. for 30 minutes. As a result, a shallow emitter having a junction depth of about 50 nanometers is formed. According to our experiments, when arsenic is subjected to heat treatment at relatively high temperatures of 1000° C. for 20 minutes to permit the arsenic to be diffused into the silicon substrate through the polysilicon thin film as set out above, an emitter having a junction depth of about 180 nanometers can be obtained. This is particularly shown in FIG. 1 which shows the relation between the concentration of arsenic and the depth of junction.

On the other hand, where an emitter having a greater depth is to be formed, diffusion under higher temperature and longer time conditions is necessary. This will inevitably entail deep diffusion of a semiconductive region such as a base which has been formed in a preceding step. It is thus known that a transistor structure suitable for high speed operations is difficult to obtain. More particularly, during the relatively high temperature treatment procedure (1000° C., 20 minutes) of forming a high-speed emitter having a depth of 180 nanometers, the depth of the base region formed by ion implantation such as of boron becomes undesirably as great as 400 to 500 nanometers or over. For instance, when a commercially available ion implanter is used to form a p-type base region at a minimum value of steady implantation acceleration energy, say, 25 KeV, which is now the most stable and is substantially free of deviation, the junction depth of the base becomes about 500 nanometers. At the time, when the depth of the emitter is 180 nanometers, the resultant transistor has a width of the base layer of about 320 nanometers. A typical collector cut-off frequency ($f_T$) of the transistor having a base width of 320 nanometers is about 5 GHz. In order to easily make a transistor whose cut-off frequency is 10 GHz, the base width should be from 100 to 200 nanometers. In this case, a necessary depth of the emitter formed by diffusion from the polysilicon is about 300 nanometers, requiring an abnormal heat treatment at very high temperatures for a long time. This leads to formation of an undesirably deep base. Thus, this procedure cannot provide a transistor having a base width of from 100 to 200 nanometers.

On the other hand, for the formation of an emitter/base junction adapted for the fabrication of bipolar transistor, there is known a method wherein an impurity such as As is ion implanted directly into a base of the p-type. For instance, as shown in FIG. 2, when $1 \times 10^{16}/cm^2$ of arsenic is directly ion implanted into silicon at an implantation accelerator energy of 50 KeV and thermally treated at 1000° C. for a diffusion time of 60 minutes (t=60 minutes), the depth of the resultant emitter is about 430 nanometers. When the diffusion time is 20 minutes (T=20 minutes), the depth is about 260 nanometers. When the thermal treatment is not effected, or immediately after the ion implantation (t=0 minute), the depth is about 100 nanometers. As is shown in FIG. 1, the depth of the emitter which is obtained by diffusing arsenic from polycrystalline silicon by thermal treatment at 1000° C. for 20 minutes is about 180 nanometers. On the other hand, the depth of the emitter which is formed by direct ion implantation of arsenic into silicon and subsequent heat treatment under the same conditions of 1000° C. and 20 minutes as used in FIG. 1 is 260 nanometers, which is larger by 80 nanometers than that of the emitter diffused from polysilicon. The amount of the arsenic impurity in the silicon is larger for the emitter formed by the direct ion implantation, resulting favorably in a lower emitter resistance. Moreover, with the emitter formed by the direction ion implantation, it is usual to take a metal electrode directly from the emitter surface without use of any polycrystalline silicon electrode as an intermediate layer. However, as an opening or contact hole of the emitter is made finer, polysilicon which has better coverage over the opening than Al is now used to prevent disconnection of electrode.

The problem involved in the formation of the emitter by diffusion from polycrystalline silicon set out with reference to FIG. 1 is the influence of a silicon oxide thin film naturally formed between the polycrystalline silicon and single crystal silicon. The natural oxide film on the single crystal silicon grows in a thickness not larger than about 2 nanometers when a non single crystalline thin film such as of polycrystalline silicon, amorphous silicon or the like is deposited. A thicker oxide film results in a smaller diffusion depth of the emitter. Moreover, the series resistance of the emitter increases as the thickness of the oxide film is increased causing transistor characteristics to degrade or deviate significantly.

The problem on the unstability caused by the natural oxide film becomes more serious in the case where a deep emitter is initially formed by ion implantation as shown in FIG. 2, after which a non single crystalline electrode such as of polycrystalline or amorphous silicon is led out from the emitter. More particularly, when a polycrystalline silicon film is deposited on the silicon surface containing an impurity of high concentration such as arsenic, the natural oxide film grows up thicker on the silicon surface than on a silicon surface with an impurity of lower concentration. This will cause the ohmic contact between the emitter and the deposited polycrystalline silicon to become increasingly worsened, resulting in a considerable increase of the emitter resistance.

Another problem involved in prior art methods is that the formation of an emitter having a depth of, for example, about 300 nanometers requires a long-term thermal treatment of 1000° C. and for about 60 minutes as shown in FIG. 1. Such a long-term thermal treatment causes a base region formed during the same thermal treatment to be diffused more deeply. The resultant transistor is not adapted for high speed purposes.

SUMMARY OF THE INVENTION

It is accordingly an object of the invention to provide a method for fabricating a semiconductor device which overcomes the problems of the prior art and wherein the instability caused by formation of a natural oxide film can be eliminated.

It is another object of the invention to provide a method for fabricating a semiconductor device wherein a junction of a desired depth such as an emitter is formed at a relatively low diffusion temperature within a short time so that the profile in concentration of an impurity such as in a base region is not varied significantly.

It is a further object of the invention to provide a method for fabricating a semiconductor device wherein a semiconductive region such as an emitter is formed in a semiconductor substrate such as single crystal silicon and when an electrode of a non-single crystalline semiconductor is taken out from the surface of the emitter region, the emitter region with a desired depth is formed at a relatively low diffusion temperature within a short time while suppressing an adverse influence of a natural oxide film as would be otherwise formed during the formation of the electrode of non-single crystalline semiconductor film on the surface of the emitter region.

According to the present invention, there is provided a method for fabricating a semiconductor device which comprises: providing a semiconductor substrate having a single crystalline semiconductor layer of a first conductivity type;

forming a first semiconductive region of a second conductivity type formed in the single crystalline semiconductor layer;

forming a dielectric film on the semiconductor substrate after or prior to the formation of the first semiconductive region;

making at least one opening in the dielectric film to expose the first semiconductive region;

forming a first non-crystalline semiconductor film on the surface of the first semiconductive region in the opening;

forming a second conductive region of the first conductivity type in the first semiconductive region by implanting an impurity of a first conductivity type through the first semiconductor film;

forming a second non-crystalline semiconductor film on the first semiconductor thin film; and incorporating an impurity of the first conductivity type into the second semiconductor film.

BRIEF DESCRIPTION OF THE DRAWINGS

FIG. 1 is a graph showing an impurity profile of arsenic diffused from polycrystalline silicon into a silicon substrate;

FIG. 2 is a graph showing an impurity profile of arsenic formed in a silicon substrate by ion implantation;

DETAILED DESCRIPTION AND EMBODIMENTS OF THE INVENTION

Figure 3A:
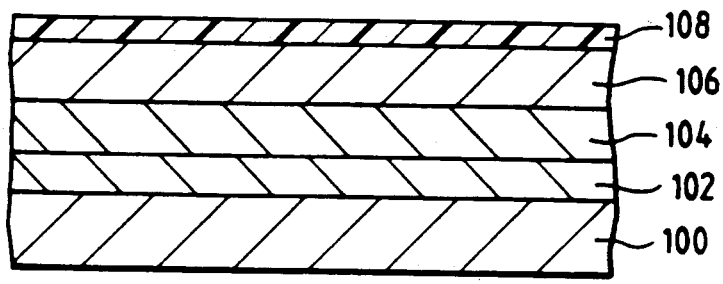
FIGS. 3a to 3d are, respectively, schematic sectional views illustrating a method for fabricating a bipolar NPN transistor according to one embodiment of the invention.

Reference is now made to the accompanying drawings and particularly, to FIGS. 3a to 3d. It will be noted that like reference numerals indicate like parts or members in the drawings.

In FIGS. 3a to 3d, there is shown a first embodiment of the invention showing fabrication of a main part of a bipolar NPN transistor.

FIG. 3a shows a P type silicon semiconductor substrate 100 on which an N-type buried layer 102 and an N-type epitaxial semiconductor layer 104 are formed in this order as shown. A silicon oxide thin film 108 having, for example, a thickness of about 200 nanometers is formed on the semiconductor layer 104. When the silicon oxide film 108 is thin, the semiconductive region 106 may be formed after the formation of the silicon oxide film 108. An impurity such as boron is implanted into the semiconductor layer 104 by a low energy ion implantation technique at a dose amount of 1 to $3 \times 10^{13}$ cm$^{-2}$, followed by thermal treatment at 800° to 1000° C., for example, at 900° C., thereby forming a semiconductive region 106 of the P type.

Figure 3B:
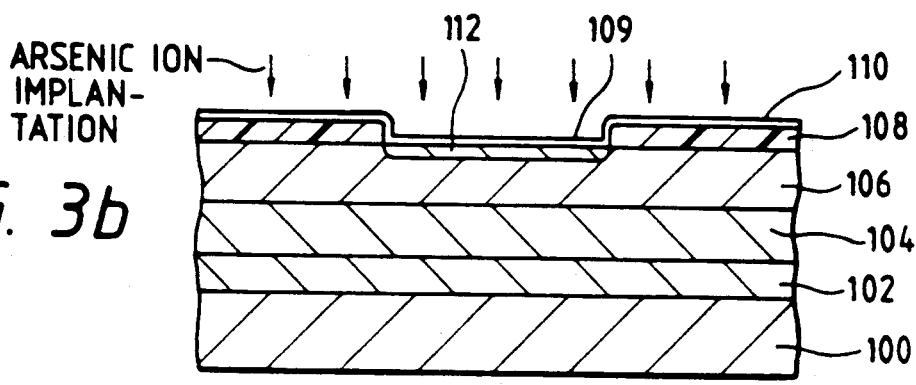

In FIG. 3b, a region of the oxide film 108 in which an emitter is to be formed is etched by an ordinary photomasking procedure to form an opening 109. Thereafter, a polysilicon thin film 110 having a thickness of about 30 nanometers is deposited over the oxide film 108 and the opening 109. Then, arsenic is ion implanted through the polysilicon film 110 at a rate of $1 \times 10^{15}$ to $5 \times 10^{16}$ cm$^{-2}$, e.g. at $1 \times 10^{16}$ cm$^{-2}$, at an acceleration energy of from 80 to 140 KeV to form an N-type semiconductive region 112 which serves as an emitter and has a depth of about 100 nanometers.

Figure 3C:
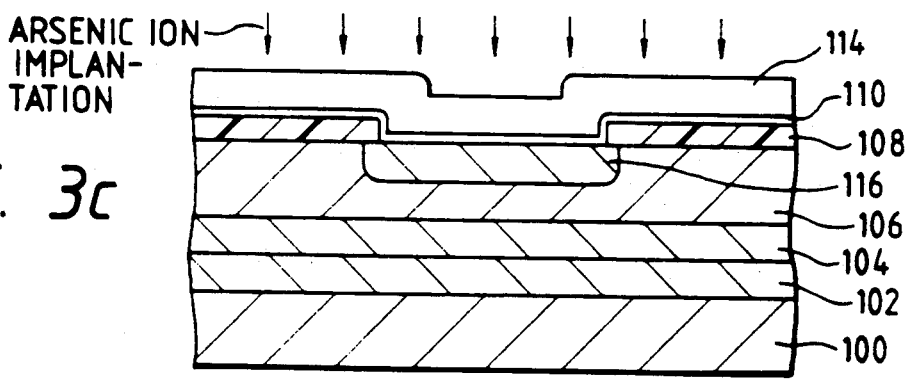

In FIG. 3c, a polysilicon thin film 114 having a thickness of about 250 nanometers is deposited over the polysilicon film 110 and is implanted with $5 \times 10^{15}$ to $5 \times 10^{16}$ cm$^{-2}$, e.g. $8 \times 10^{15}$ cm$^{-2}$, of arsenic at an acceleration energy of 50 KeV, followed by thermal treatment, for example, at about 1000° C. for 20 minutes thereby converting the N-type semiconductive region 112 forming an N-type semiconductive region 116 which serves as an emitter and has a depth of about 300 nanometers. It will be noted that the P-type semiconductive region 106 serving as a base has a depth of about 450 nanometers.

Figure 3D:
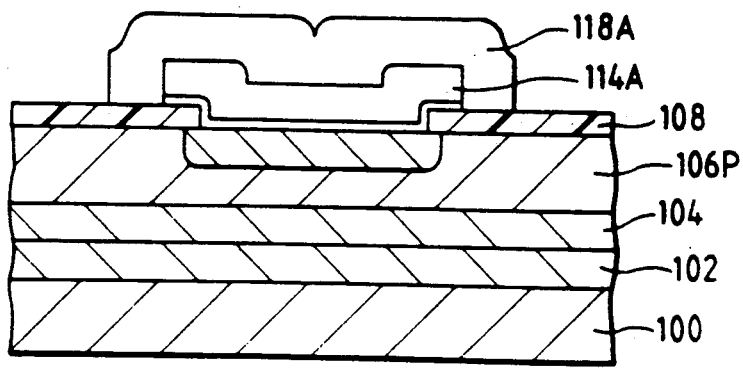

In FIG. 3d, the polysilicon film is subjected to photo-masking to form a polysilicon film pattern electrode 114A. Thereafter, a metal electrode such as Al 118 A is formed on the electrode 114A according to an ordinary technique.

In this manner, a vertical type of NPN transistor whose current amplification factor is increased and improved is obtained according to the method of the invention. This transistor has such a narrow base layer structure that the base width is about 150 nanometers and high speed properties are good. If the ion implantation acceleration energy such as for arsenic is further increased to a level of 140 to 200 KeV, the emitter can be made to have more depth or result in a thickness of 300 to 400 nanometers. A base width of about 100 nanometers which ensures a higher speed transistor structure can be realized. Moreover, when arsenic is implanted through the first semiconductor thin film such as the polysilicon to form a lead electrode an emitter with a desired depth can be formed at relatively low diffusion temperatures ranging from 800° to 1000° C. for a short time of from a few seconds to 30 minutes while suppressing the influence of an increase in connection resistance caused by the growth of natural oxide film.

In the above embodiment, the polysilicon is used as the first semiconductor thin film, amorphous semiconductors such as amorphous silicon may be likewise used. When amorphous silicon is used, so-called channeling can be prevented at the time of ion implanting arsenic or the like impurity in order to form the emitter, with an attendant advantage that the emitter formed has a uniform thickness. Instead of arsenic, there may be used phosphorus, antimony and the like.

The advantages and features of the first embodiment are as follows.

(1) Since an impurity of the first conductivity type is implanted through the first semiconductor thin film such as polysilicon, the second semiconductive region of the first conductivity type such as the emitter is formed deeply in the first semiconductive region such as the base. Thus, an emitter with a desired depth can be formed at relatively low diffusion temperatures within a short time while suppressing the influence of the natural oxide film as described before.

(2) When an impurity of the first conductivity type is implanted through the first semiconductor thin film such as polysilicon, the natural oxide film which has been formed between the semiconductor thin film such as polysilicon and the first single crystalline semiconductive region such as the base can be broken to an extent. Accordingly, the ohmic contact between the semiconductor thin film serving as a lead electrode and the second semiconductive region of the first conductivity type such as the emitter is improved, thereby lowering the series resistance of the emitter.

(3) Since the second non-crystalline semiconductor thin film such as polysilicon can be formed on the first semiconductor thin film such as polysilicon, the second semiconductor thin film serving as the lead electrode can be formed in a desired thickness with the following attendant advantages. The presence of the second semiconductor thin film of the first conductivity type (e.g. N-type) such as polysilicon having a thickness of about 300 nanometers and formed on the semiconductive region such as the emitter permits the holes implanted from the base into the emitter to diffuse into the second semiconductor thin film such as polysilicon. Thus, the holes do not directly arrive at the metal electrode formed on the second polysilicon layer, leading to a decrease of the hole current, i.e. base current.

The current amplification factor of the transistor can be significantly improved.

A second embodiment of the invention which is applied to the fabrication of a bipolar NPN transistor is described with reference to FIGS. 4a to 4e.

Figure 4A:
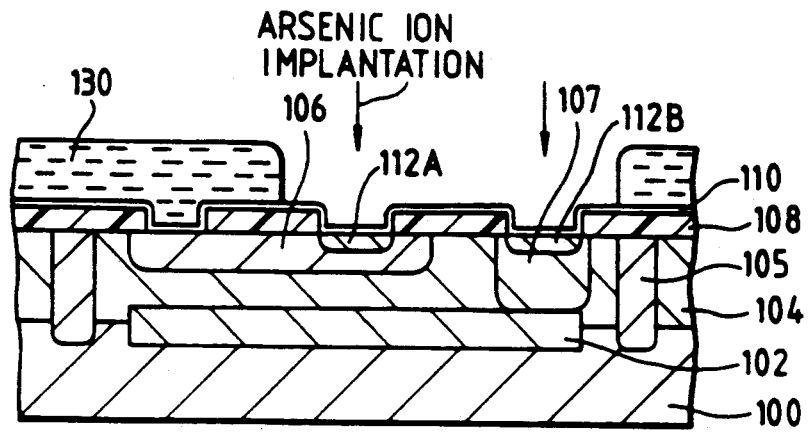
FIGS. 4a to 4e are, respectively, schematic sectional views illustrating a method for fabricating a bipolar NPN transistor according to a second embodiment of the invention.

In FIG. 4a, a P-type silicon semiconductor substrate 100 is provided, on which an N-type buried layer 102 is formed. Thereafter, an N-type epitaxial semiconductor layer 104 is formed over the substrate 100 including the layer 102. After formation of P-type element isolation regions 105 through the layer 104 and then an about 200 nanometer thick silicon oxide film 108, an impurity such as boron is selectively implanted into the semiconductor layer 104 in a dose amount of 1 to $3 \times 10^{13} cm^{-2}$ by ion implantation to form a p-type semiconductive region 106 serving as a base. Similarly, an impurity such as phosphorus is selectively implanted into the semiconductor layer 104 in a dose amount of $5 \times 10^{15} cm^{-2}$ by ion implantation to form an N-type semiconductive region 107 serving as a collector-plug region.

Subsequently, the regions 106 and 107 are subjected to thermal treatment at about 900° C. to allow the regions to be made deep. The oxide film 108 on the p-type semiconductive region 106 is etched to form an opening for base and an opening for emitter. At the same time, an opening for collector is formed in the oxide film 108 on the N-type semiconductor layer serving as the collector-plug region. Subsequently, an about 50 nanometer thick polysilicon thin film 110 is deposited over as shown. $1 \times 10^{15} cm^{-2}$ of arsenic is ion implanted through the polysilicon thin film 110 and a photoresist 130 at an acceleration energy of 80 to 140 KeV thereby forming N-type semiconductive regions 112A, 112B each having a depth of about 100 nanometers.

Figure 4B:
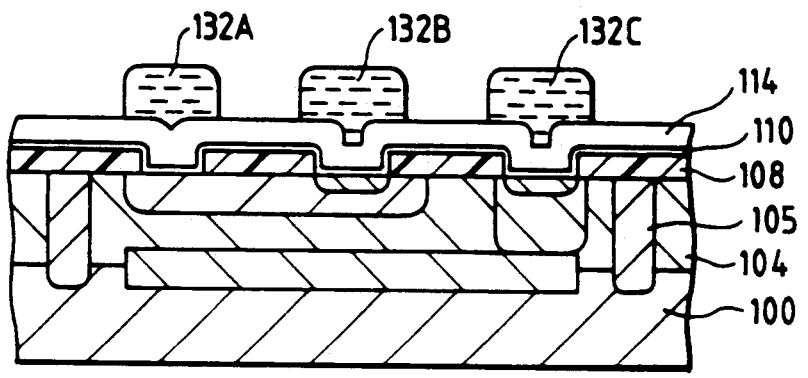

In FIG. 4b, an about 250 nanometer thick polysilicon thin film 114 is deposited on the polysilicon thin film 110. Resist patterns 132A, 132B and 132C are, respectively, formed on the portions of the polysilicon film 114 under which the openings for base, emitter and collector have been formed as shown.

Figure 4C:
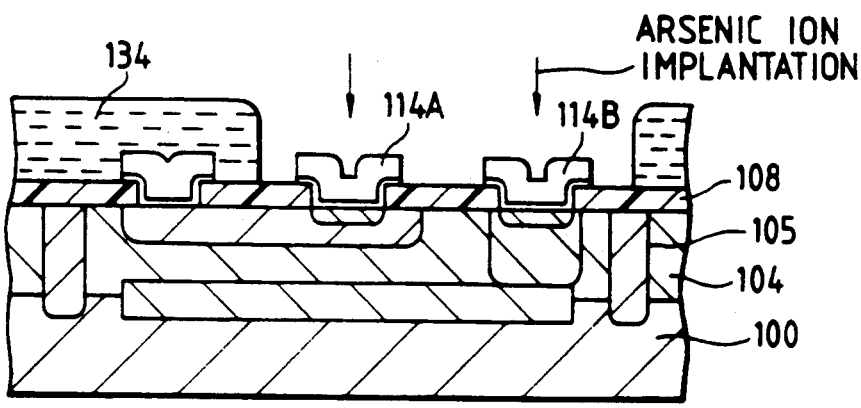

In the step of FIG. 4c, the polysilicon thin films 114 and 110 are subjected to patterning by the use of the resist patterns 132A, 132B and 132C, which are subsequently removed, followed by forming a resist pattern 134 through a photo-masking procedure. Next, $8 \times 10^{15} cm^{-2}$ of arsenic is ion implanted into the polysilicon thin films 114A, 114B through the resist pattern mask 134 at an acceleration energy of 50 KeV.

Figure 4D:
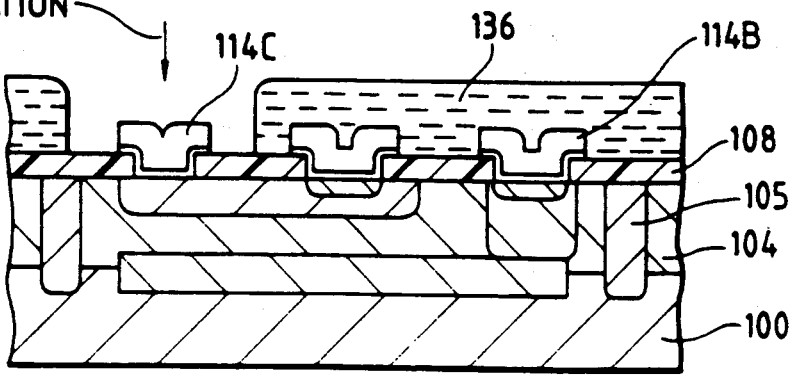

In FIG. 4d, a resist pattern 136 is formed by a photo-masking procedure for use as a mask, through which $8 \times 10^{15} cm^{-2}$ of boron is ion implanted at an acceleration energy of 40 KeV into the polysilicon thin film 114C serving as a base-lead electrode.

Figure 4E:
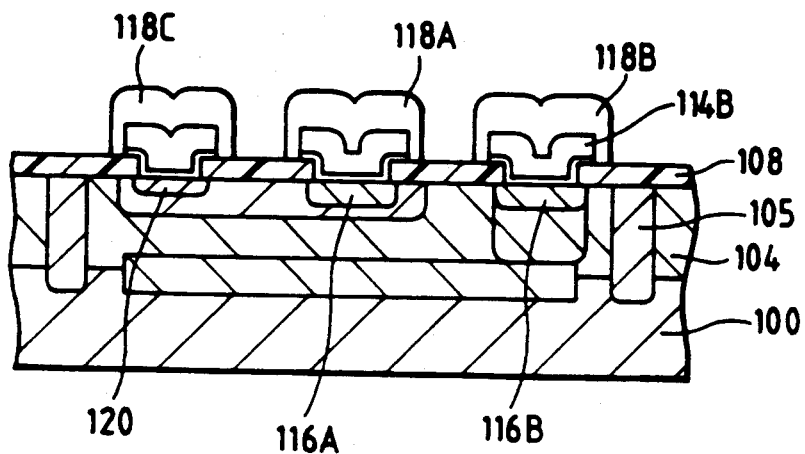

In FIG. 4e, the article obtained in FIG. 4d is subjected to thermal treatment under conditions of a temperature of from 800° to 1050° C. and a time of from a sew seconds to 30 minutes, say, at temperatures of about 1000° C. for 20 minutes, to form an about 250 nanometer thick P-type semiconductive region 120. Simultaneously, an N-type semiconductive region 116A serving as an emitter and an N-type semiconductive region 116B serving as a collector-plug region each having a depth of about 300 nanometers are formed by diffusion. Subsequently, metal electrodes 118A, 118B, 118C such as A1 are formed to cover the regions 114A, 114B and 114C, respectively, according to any known procedure.

As will be apparent from the above, when an impurity such as arsenic is implanted through the first semiconductor thin film such as polysilicon serving as an emitter-lead electrode, an emitter with a desired thickness can be formed, as having a low series resistance, at relatively low diffusion temperatures within a short time while suppressing the influence of natural oxide film. In addition, the polysilicon electrode for leading out a base can be formed as having a low series resistance. Thus, selective ion implantation of impurities into the polysilicon electrodes ensures formation of lead electrodes of different conductivity types having good coverage properties.

A third embodiment applied to the fabrication of a bipolar NPN transistor is described with reference to FIGS. 5a to 5d.

Figure 5A:
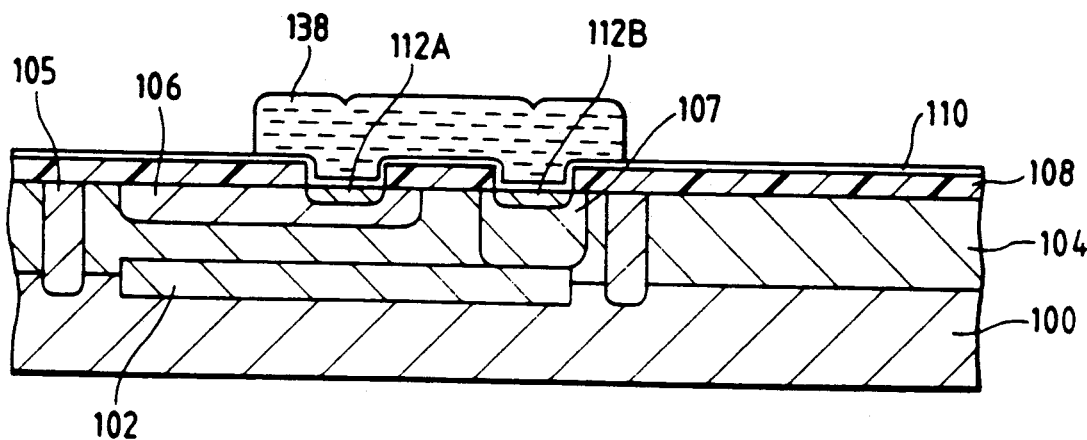
FIGS. 5a to 5d are, respectively, schematic sectional views illustrating a method for fabricating a bipolar NPN transistor according to a third embodiment of the invention.

In FIG. 5a, after formation of an N-type buried layer 102 in a P-type silicon semiconductor substrate 100, an N-type epitaxial semiconductor layer 104 is formed over the substrate 100. Next, P-type element isolation regions 105 are formed as shown and an about 200 nanometer thick silicon oxide film 108 is formed, after which boron is selectively implanted into the semiconductor layer 104 by ion implantation in a dose amount of from 1 to $3 \times 10^{12} cm^{-2}$ to form a P-type semiconductive region 106 serving as a base. Likewise, phosphorus is selectively implanted into the semiconductor layer 104 by ion implantation in a dose amount of $5 \times 10^{15} cm^{-2}$ to form an N-type semiconductive region 107 serving as a collector-lead region. The thermal treatment at a temperature of about 900° C. is followed to form the semiconductive regions 106, 107. An opening for emitter is formed in the oxide film 108 on the P-type semiconductive region 106. An opening for collector is formed in the oxide film 108 on the N-type semiconductor region 107 serving as a collector-plug region is formed with an opening for collector. Over the entire surface is deposited an about 50 nanometer thick polysilicon thin film 110. Subsequently, an impurity such as arsenic is ion implanted through the polysilicon thin film in an amount of $1 \times 10^{15} cm^{-2}$ at an acceleration energy of from 80 to 140 KeV to form N-type semiconductive regions 112A, 112B each having a depth of about 100 nanometers. A resist pattern 138 is formed by a photomasking procedure as shown.

Figure 5B:
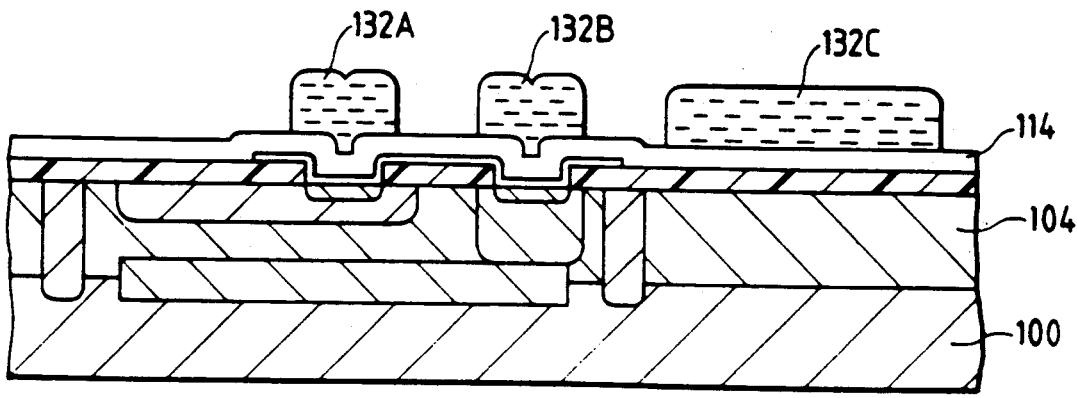

In FIG. 5b, the polysilicon layer 110 is subjected to patterning through the mask of the resist pattern 138, followed by deposition of an about 250 nanometer thick polysilicon thin film 114 over the entire surface. The portions of the film 114 which have been formed on the openings for emitter and collector are formed with resist patterns 132A, 132B, respectively, as shown. Moreover, a resist pattern 132C is formed on a prospective formation region of a ribbon-shaped resistor.

Figure 5C:
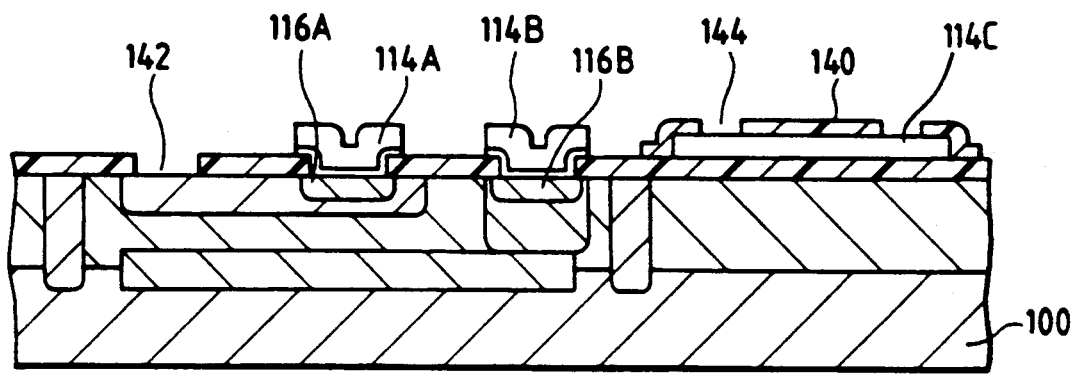

In FIG. 5c, the polysilicon thin films 114, 110 are subjected to patterning through the masks of the resist patterns 132A, 132B and 132C, followed by removal of the resist patterns 132A, 132B and 132C. Then, a resist pattern (not shown) is formed similar to the foregoing embodiments by a photo-masking procedure, through which arsenic is selectively ion implanted into the polysilicon thin films 114A, 114B in a dose amount of, for example, $8 \times 10^{15} cm^{-2}$ at an acceleration energy of 50 KeV. Similarly, after formation of a resist pattern (not shown) by a photo-masking procedure, boron is selectively ion implanted into the polysilicon thin film 114C through the mask of the resist pattern at an acceleration energy of 50 KeV in a dose amount of, for example, $5 \times 10^{15} cm^{-2}$ which varied depending upon the desired level of resistance. For thermal diffusion of the arsenic and boron, thermal treatment, for example, at 1000° C. for 20 minutes is effected to form an N-type semiconductive region 116A serving as emitter and an N-type semiconductive region 116B serving as a collector-plug region each having a depth of about 300 nanometers. According to an ordinary procedure, the surface of the P-type silicon resistor is insulated with a CVD silicon oxide film 140. An opening 142 serving as a contact of base and openings 144 at opposite sides of the ribbon-shaped resistor 114 are formed.

Figure 5D:
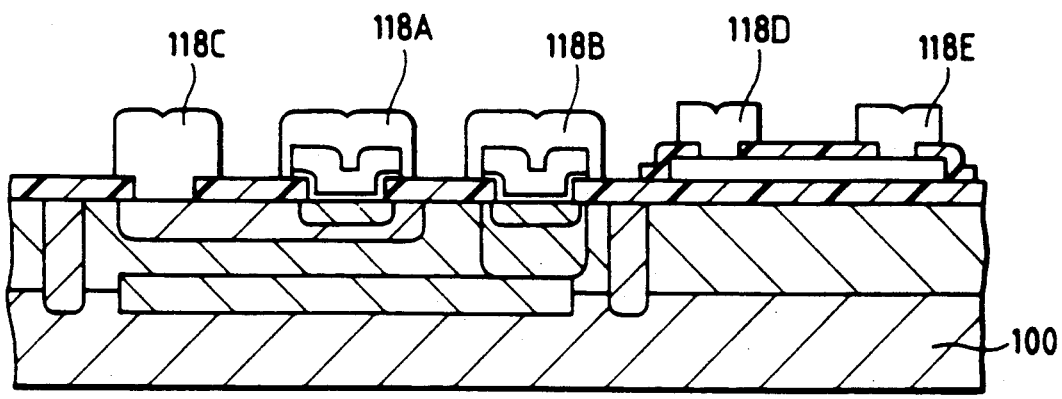

In FIG. 5d, according to any known procedure, metal electrodes 118A to 118E are formed as shown.

As will be apparent from the above embodiment, when an impurity such as arsenic is implanted through the first semiconductor thin film which serves as a thin film such as of polysilicon for an emitter electrode, an emitter having a desired thickness can be formed at relatively low diffusion temperatures within a short time while suppressing the influence of the connection resistance caused by the growth of natural oxide film. The depth of the emitter can be properly controlled by controlling the acceleration energy, the dose amount and the thermal treatment conditions. In addition, the thus formed emitter has a low series resistance. In this third embodiment, the polysilicon thin film of a ribbon form serving as a resistor can be formed by one deposition procedure by which its thickness can be controlled as desired. This leads to formation of a resistor of high accuracy. Further, this polysilicon emitter is commonly used as a lead electrode for emitter, so that the fabrication procedure becomes simple. In this embodiment, the first non-crystalline semiconductor thin film may be made of amorphous silicon similar to the first embodiment by which channeling as will occur during the ion implantation of arsenic can be prevented.

A fourth embodiment is described with reference to FIGS. 6a to 6d in which an insulated gate field effect transistor such as an MOS transistor is fabricated according to the invention.

Figure 6A:
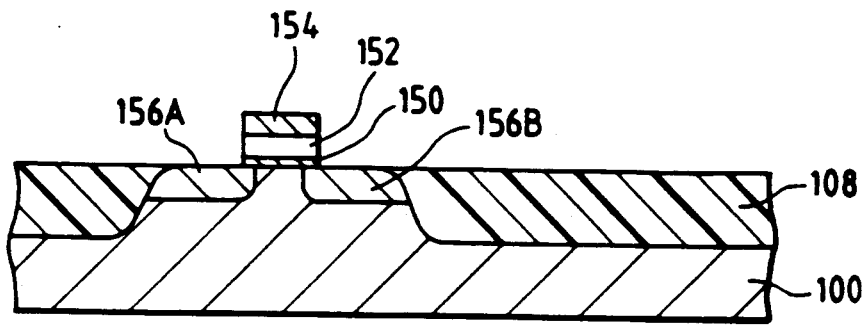
FIGS. 6a to 6d are, respectively, schematic sectional views illustrating a method for fabricating a MOS transistor according to a fourth embodiment of the invention.

In FIG. 6a, after formation of a silicon oxide film 108 for element isolation on a P-type silicon semiconductor substrate 100, an oxide film 150 serving as a gate oxide film is thermally grown up to a thickness of about 10 to 20 nanometers. Over the entire surface are deposited a polysilicon 152 for gate electrode and a CVD silicon oxide film 154 in this order. After a resist pattern (not shown) has been formed by an ordinary photo-masking procedure, a pattern of the gate oxide film 150, polysilicon layer 152 for gate electrode and CVD silicon oxide film 154 is formed through the resist pattern mask. The resultant pattern is used as a mask for selective implantation of 1 to $3 \times 10^{13} cm^{-2}$ of phosphorus into the semiconductor substrate 100, thereby forming N-type semiconductive regions 156A and 156B serving as a source and a drain, respectively. The thermal treatment at about 900° C. for 20 to 30 minutes is followed to allow the regions 156A and 156B to be diffused more deeply.

Figure 6B:
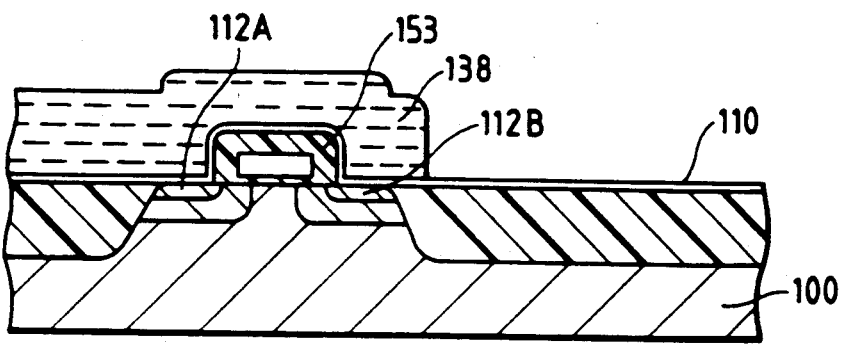

In FIG. 6b, after selectively leaving CVD $SiO_2$ 153 at the sides of the polysilicon layer 152 for the gate electrode, a polysilicon thin film 110 having a thickness of about 50 nanometers is deposited over the entire outer surface. Subsequently, $1 \times 10^{15} cm^{-2}$ of arsenic is ion implanted through the polysilicon film 110 at an accelerator energy of from 80 to 140 KeV to form N-type semiconductive regions 112A, 112B each having a depth of about 100 nanometers. In order to ensure good electric contact between the polysilicon 110 and a second polysilicon formed in a subsequent step, 1 to $5\times 10^{15}$cm$^{-2}$ of arsenic is ion implanted into the polysilicon 110 at a low acceleration energy of from 5 to 10 KeV, followed by forming a resist pattern 138 by a photo-masking technique.

Figure 6C:
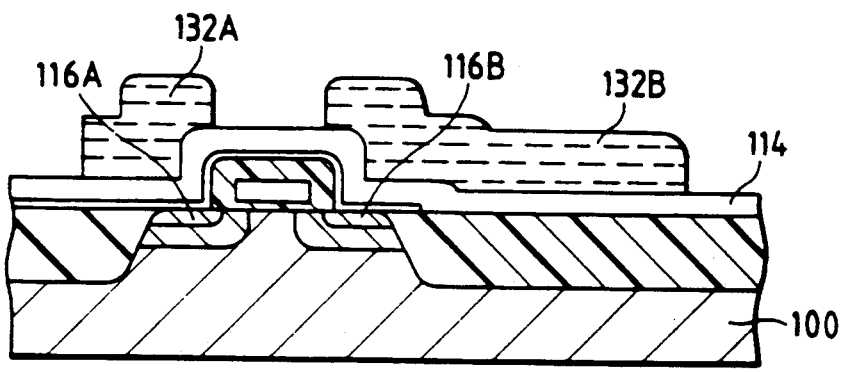

In FIG. 6c, the polysilicon film 110 is subjected to patterning in the vicinity of the openings for source and drain through the resist pattern 138 shown in FIG. 6b. After removal of the resist pattern 138, a second polysilicon thin film 114 having a thickness of about 250 nanometers is deposited over the entire surface, followed by forming resist patterns 132A, 132B on the thin film 114.

Figure 6D:
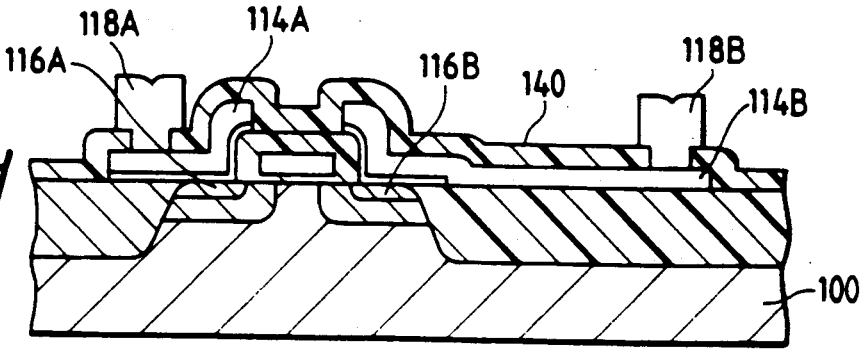

In FIG. 6d, the resist patterns 132A, 132B are used as a mask for patterning the polysilicon thin films 114, 110 followed by removal of the resist patterns 132A, 132B. Moreover, a resist pattern (not shown) is formed by a photo-masking procedure and is used as a mask for ion implantation of arsenic into the polysilicon thin film 114A in a dose amount of $8\times 10^{15}$cm$^{-2}$ at an acceleration energy of 50 KeV. Similarly, a resist pattern (not shown) is formed by a photo-masking procedure, after which arsenic is ion implanted into the polysilicon thin film 114B through the resist pattern mask in a dose amount of 1 to $3\times 10^{13}$cm$^{-2}$ at an acceleration energy of 50 KeV. The thermal treatment at about 900° C. for 20 minutes is followed thereby forming an N-type semiconductive region 116A serving as a source and an N-type semiconductive semiconductive region 116B serving as a drain, each having a depth of about 200 nanometers. The surface N-type polysilicon resistor 114B of high resistance is isolated with a CVD silicon oxide film 140. An opening serving as a contact for the source and an opening at one side of the resistor 114B are formed as shown and are, respectively, led out with metal electrodes 118A, 118B. Such electrodes may be made of aluminium.

As will be apparent from the above embodiment, an impurity is ion implanted through the first semiconductor thin film which is a thin film such as of polysilicon serving as a lead electrode such as for a source. By this, a source with a desired depth can be formed at relatively low diffusion temperatures within a short time while suppressing the influence of an increase in connection resistance caused by growth of a natural oxide film. Thus, a low series resistance source can be realized. In addition, the thickness of the ribbon-shaped polysilicon thin film for high resistance can be formed as controlled in thickness and the polysilicon thin film for this high resistance can be directly connected to a polysilicon thin electrode for drain, so that a transistor unit wherein a load resistor of high accuracy and high resistance is connected can be made fine.

The method of the invention is applicable to bipolar elements and MOS field effect transistors. For instance, for the fabrication of Bi-CMOS devices where bipolar elements and CMOS elements co-exist, if the source and drain of the CMOS are diffused by thermal treatment of low temperature and short time whereupon the emitter of the bipolar element is formed simultaneously, only a shallow emitter is formed and thus an emitter with a desired thickness cannot be obtained. However, according to the method of the invention, an emitter with a desired depth can be formed. The method of the invention may be applied to the fabrication of various semiconductor devices.

In the foregoing embodiments, a p-type silicon substrate is used, but other substrates made of germanium, gallium arsenide and the like may be likewise used. In some case, an N-type substrate may be used to form a junction field effect transistor. Moreover, arsenic, boron and phosphorus are employed as the impurities used to form semiconductive regions, but it is a matter of course that other impurities such as antimony, phosphorus and the like may be used instead of arsenic and impurities such as gallium instead of boron. The depths or thicknesses of the respective layers or regions, the concentrations of the impurities and the acceleration energy are specifically set out in these embodiments, but these values are not necessarily critical. This is also true of the thermal treatment conditions. Although the thermal treatment used in these embodiment may vary depending on the degree of diffusion, the treatment is generally conducted at a temperature ranging from 800° to 1100° C. for a time of from a few seconds to 60 minutes.

What is claimed is:

1. A method for fabricating a field effect type semiconductor device which comprises:
    providing a semiconductor substrate having a single crystal semiconductor layer of a first conductivity type;
    forming an element isolation dielectric film and a gate insulating dielectric film on said single crystal semiconductor layer;
    forming a gate electrode on said gate insulation dielectric film;
    forming a source by forming a first semiconductive region of a second conductivity type and a drain by forming a second semiconductive region of a second conductivity type in said single crystal semiconductor layer near opposite sides of said gate electrode;
    forming a dielectric film on the gate electrode, the source and the drain;
    forming openings for the source and the drain in the dielectric film formed on the gate electrode, the source and the drain to expose said single crystal semiconductor layer;
    forming a first non-crystalline semiconductor thin film on the surface of said single crystal semiconductor layer in said openings;
    implanting an impurity of the second conductivity type through said first non-crystalline semiconductor thin film, thereby forming a third semiconductive region of the second conductivity type in said first semiconductive region and a fourth semiconductive region of the second conductivity type in said second conductive region provided at opposite side of said gate electrode, respectively;
    forming a second non-crystalline semiconductor thin film on said first non-crystalline film; and
    incorporating an impurity of the second conductivity type into said second non-crystalline semiconductor film.

2. The method according to claim 1, wherein said second non-crystalline semiconductor film is formed after patterning of said first semiconductor film to leave said first semiconductor film on the openings for source and drain provided at opposite sides of said gate electrode and after removal of said first semiconductor film from said element isolation dielectric film for element isolation, and is subsequently subjected to patterning so that a resistor of said second semiconductor thin film is led out from the patterns of said first non-crystalline semiconductor film left on the openings to said element isolation dielectric film for element isolation.

3. The method according to claim 1, wherein the impurity of the second conductivity type is incorporated into the first non-crystalline semiconductor film after the formation of the third and fourth semiconductive regions but prior to the deposition of said second non-crystalline semiconductor film.

* * * * *